(12) United States Patent
Miyoshi

(10) Patent No.: US 8,114,786 B2
(45) Date of Patent: Feb. 14, 2012

(54) HEAT TREATMENT METHOD, HEAT TREATMENT APPARATUS AND SUBSTRATE PROCESSING APPARATUS

(75) Inventor: Hidenori Miyoshi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 224 days.

(21) Appl. No.: 12/302,860

(22) PCT Filed: May 28, 2007

(86) PCT No.: PCT/JP2007/060781
§ 371 (c)(1),
(2), (4) Date: Nov. 28, 2008

(87) PCT Pub. No.: WO2007/139049
PCT Pub. Date: Dec. 6, 2007

(65) Prior Publication Data
US 2009/0163038 A1 Jun. 25, 2009

(30) Foreign Application Priority Data
May 31, 2006 (JP) .................. 2006-152369

(51) Int. Cl.
*H01L 21/31* (2006.01)
(52) U.S. Cl. ............. 438/781; 438/782; 257/E21.241; 257/E21.324; 427/123; 432/93; 118/724; 118/725; 392/416; 266/94

(58) Field of Classification Search .......... 438/781–783; 257/E21.241, E21.324; 134/3; 427/123, 427/124
See application file for complete search history.

(56) References Cited

U.S. PATENT DOCUMENTS

| | | | | |
|---|---|---|---|---|
| 5,998,522 | A * | 12/1999 | Nakano et al. ................ | 524/315 |
| 6,803,548 | B2 * | 10/2004 | Wang et al. ................... | 219/494 |
| 7,709,394 | B2 * | 5/2010 | Miyoshi et al. .............. | 438/706 |
| 2003/0032234 | A1 | 2/2003 | Suzuki | |
| 2003/0041971 | A1 | 3/2003 | Kido et al. | |
| 2005/0215053 | A1 * | 9/2005 | Soininen et al. ............. | 438/658 |
| 2006/0210812 | A1 | 9/2006 | Shiota | |
| 2008/0047583 | A1 * | 2/2008 | Fukunaga et al. ................ | 134/3 |

FOREIGN PATENT DOCUMENTS

| | | |
|---|---|---|
| JP | 2003 006081 | 2/2003 |
| JP | 2004 002752 | 1/2004 |
| JP | 2004 207751 | 7/2004 |
| JP | 2005 183697 | 7/2005 |

* cited by examiner

*Primary Examiner* — Hsien Ming Lee
(74) *Attorney, Agent, or Firm* — Oblon, Spivak, McClelland, Maier & Neustadt, L.L.P.

(57) ABSTRACT

Disclosed is a heat treatment unit 4 serving as a heat treatment apparatus, which includes a chamber 42 for containing a wafer W on which a low dielectric constant interlayer insulating film is formed, a formic acid supply device 44 for supplying gaseous formic acid into the chamber 42, and a heater 43 for heating the wafer W in the chamber 42 which is supplied with formic acid by the formic acid supply device 44.

11 Claims, 5 Drawing Sheets

HEAT TREATMENT METHOD, HEAT TREATMENT APPARATUS AND SUBSTRATE PROCESSING APPARATUS

FIELD OF THE INVENTION

The present invention relates to a heat treatment method and a heat treatment apparatus for performing a heat treatment on a substrate having a specific coating film or a substrate having an interlayer insulating film of a low dielectric constant (low-k film) and a substrate processing apparatus including the heat treatment apparatus.

BACKGROUND OF THE INVENTION

Recently, a semiconductor device has been designed to have multilayer interconnection for the purpose of improving its operating speed and reducing its size. Further, it is necessary to reduce resistances of lines and electric capacitances between lines in order to increase its operating speed. Accordingly, copper (Cu) having a low resistance is widely used in the lines, and a low dielectric constant material is widely used in an interlayer insulating film provided between the Cu lines to reduce capacitance between the Cu lines.

The interlayer insulating film made of a low dielectric constant material (low-k film) is formed on a surface of a semiconductor wafer by employing a spin on dielectric (SOD) method or a chemical vapor deposition (CVD) method. In the SOD method, a coating solution is supplied to the surface of the semiconductor wafer and the coating solution is spread by rotating the semiconductor wafer, thereby forming the low-k film. In the CVD method, a source gas is supplied to the surface of the semiconductor wafer and products are deposited by decomposition or composition through chemical reactions, thereby forming the low-k film.

In a case in which the low-k film is formed by the SOD method, the heat treatment is performed on the semiconductor wafer after the low-k film has been formed to relieve internal stress in the low-k film and to ensure its mechanical strength. Further, even in a case in which the low-k film is formed by the CVD method, the heat treatment is occasionally required for a certain selected low-k material. The heat treatment is generally performed in a vacuum or nitrogen gas atmosphere. However, it is very difficult to make a complete vacuum or nitrogen gas atmosphere, and impurities such as oxygen can be easily contained in the atmosphere. Accordingly, in these methods, there is a worrisome possibility that the low-k film may be degraded (oxidized) due to oxygen contained in the atmosphere.

Thus, it has been attempted to perform the heat treatment in an atmosphere of a hydrogen gas or ammonia gas widely used as a reactant (reducing) gas (see, for example, Patent Document 1). However, it is difficult to completely prevent degradation of the low-k film with reactivity of a hydrogen gas or ammonia gas.

Patent Document 1: Japanese Laid-open Publication No. 2003-158126

SUMMARY OF THE INVENTION

It is an object of the present invention to provide a heat treatment method and a heat treatment apparatus capable of surely preventing degradation of a coating film or low-k film.

It is another object of the present invention to provide a substrate processing apparatus including the heat treatment apparatus.

In accordance with a first aspect of the present invention, there is provided a heat treatment method comprising: preparing a substrate having a coating film; and heating the substrate under an atmosphere of a reducing organic compound.

In accordance with a second aspect of the present invention, there is provided a heat treatment method comprising: preparing a substrate having an interlayer insulating film of a low dielectric constant (low-k film); and heating the substrate under an atmosphere of a reducing organic compound.

In accordance with a third aspect of the present invention, there is provided a heat treatment method comprising: loading a substrate having a coating film into a processing chamber; supplying a gaseous reducing organic compound into the processing chamber; and heating the substrate in the processing chamber supplied with the gaseous organic compound.

In accordance with a fourth aspect of the present invention, there is provided a heat treatment method comprising: loading a substrate having an interlayer insulating film of a low dielectric constant (low-k film) into a processing chamber; supplying a gaseous reducing organic compound into the processing chamber; and heating the substrate in the processing chamber supplied with the gaseous organic compound.

In the third and fourth aspects, the gaseous organic compound may be produced by bubbling a liquid or solid organic compound by a nonreactive gas. Further, a diluent gas for diluting the organic compound may be supplied into the processing chamber when the organic compound is supplied. Further, the substrate may be heated in the processing chamber while an inner pressure of the processing chamber is reduced to a predetermined pressure.

In the first to fourth aspects, the organic compound may include at least one of alcohol, aldehyde and carboxylic acid.

In accordance with a fifth aspect of the present invention, there is provided a heat treatment apparatus comprising: a processing chamber for accommodating a substrate having a coating film; an organic compound supply device for supplying a gaseous reducing organic compound into the processing chamber; and a heater for heating the substrate in the processing chamber supplied with the gaseous organic compound.

In accordance with a sixth aspect of the present invention, there is provided a heat treatment apparatus comprising: a processing chamber for accommodating a substrate having an interlayer insulating film of a low dielectric constant (low-k film); an organic compound supply device for supplying a gaseous reducing organic compound into the processing chamber; and a heater for heating the substrate in the processing chamber supplied with the gaseous organic compound.

In the fifth and sixth aspects, the organic compound supply device may produce the gaseous organic compound by bubbling a liquid or solid organic compound by a nonreactive gas and supply the gaseous organic compound into the processing chamber. Further, the heat treatment apparatus may further include a diluent gas supply device which supplies a diluent gas for diluting the organic compound into the processing chamber.

Further, in the fifth and sixth aspects, the heat treatment apparatus may further include a depressurizing device for reducing an inner pressure of the processing chamber to a predetermined pressure at least when the substrate is heated by the heater.

Further, in the fifth and sixth aspects, the organic compound supply device may supply the organic compound including at least one of alcohol, aldehyde and carboxylic acid.

In accordance with a seventh aspect of the present invention, there is provided a substrate processing apparatus comprising: a coating process unit for forming a coating film on a substrate; and a heat treatment unit for performing a heat treatment on the substrate, wherein the heat treatment unit includes: a processing chamber for accommodating the substrate; an organic compound supply device for supplying a gaseous reducing organic compound into the processing chamber; and a heater for heating the substrate in the processing chamber supplied with the gaseous organic compound.

In accordance with an eighth aspect of the present invention, there is provided a computer-readable storage medium which is operated on a computer and stores a program for controlling a heat treatment apparatus, wherein the program controls the heat treatment apparatus to perform a heat treatment method including: loading a substrate having a coating film into a processing chamber; supplying a gaseous reducing organic compound into the processing chamber; and heating the substrate in the processing chamber supplied with the gaseous organic compound.

In accordance with a ninth aspect of the present invention, there is provided a computer-readable storage medium which is operated on a computer and stores a program for controlling a heat treatment apparatus, wherein the program controls the heat treatment apparatus to perform a heat treatment method including: loading a substrate having an interlayer insulating film of a low dielectric constant (low-k film) into a processing chamber; supplying a gaseous reducing organic compound into the processing chamber; and heating the substrate in the processing chamber supplied with the gaseous organic compound.

In accordance with the first and second aspects of the present invention, after a coating film or low-k film is formed on a substrate, the substrate is heated under an atmosphere of an organic compound having higher reducibility than hydrogen and ammonia. Accordingly, a heat treatment can be performed on the substrate while oxygen in the heating atmosphere is efficiently removed by a reduction reaction of the organic compound. Thus, it is possible to prevent degradation of a specific coating film or low-k film.

Further, in accordance with the third to seventh aspects of the present invention, after a coating film or low-k film is formed on a substrate, the substrate is loaded into a processing chamber and a gaseous organic compound having higher reducibility than hydrogen and ammonia is supplied into the processing chamber. Then, the substrate is heated in the processing chamber supplied with the organic compound. Accordingly, the organic compound can be efficiently filled in the processing chamber, and a heat treatment can be performed on the substrate while oxygen in the heating atmosphere is efficiently removed by a reduction reaction of the organic compound. Thus, it is possible to prevent degradation of a specific coating film or low-k film.

DETAILED DESCRIPTION OF THE EMBODIMENTS

Hereinafter, embodiments of the present invention will be described in detail with reference to the accompanying drawings which form a part hereof.

Figure 1:
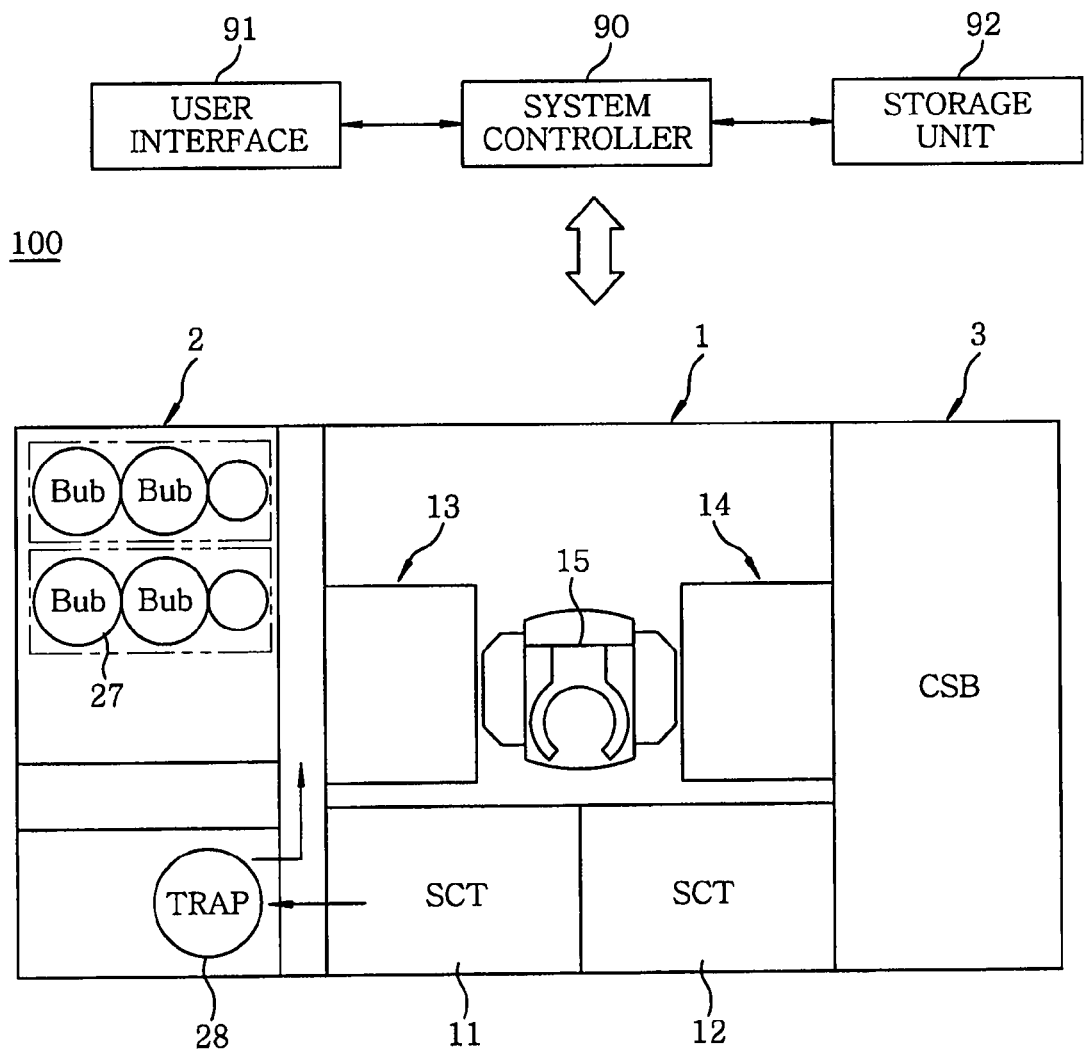
FIG. 1 schematically shows a plan view of an SOD system including a heat treatment unit capable of performing a heat treatment method in accordance with the present invention.

FIG. 1 schematically shows a plan view of an SOD system including a heat treatment unit capable of performing a heat treatment method in accordance with the present invention.

The SOD system (substrate processing apparatus) 100 includes a processing section 1, a side cabinet 2 and a carrier station (CSB) 3. The side cabinet 2 and the carrier station (CSB) 3 are disposed at opposite sides of the processing section 1, respectively.

The processing section 1 includes coating process units (SCT) 11 and 12, processing unit sets 13 and 14 each having a plurality of processing units stacked in multiple levels, and a transfer arm 15 for transferring a semiconductor wafer (substrate) W therebetween. The transfer arm 15 is disposed in a central portion of the processing section 1. The processing unit sets 13 and 14 are disposed at sides of the transfer arm 15 adjacent to the side cabinet 2 and the carrier station (CSB) 3, respectively. The coating process units (SCT) 11 and 12 are disposed right in front of the processing unit sets 13 and 14. A coating solution storage part (not shown) for storing a coating solution or the like used in the coating process units (SCT) 11 and 12 is disposed, for example, under the coating process units (SCT) 11 and 12.

The coating process units (SCT) 11 and 12 are configured such that a specific coating solution for a low-k film, a hard mask layer or the like is supplied to a surface of the wafer W held by, for example, a spin chuck, and the spin chuck is rotated to spread the coating solution on the surface of the wafer W, thereby forming a coating film such as a low-k film or a hard mask layer.

The processing unit set 13 includes a low temperature hot plate unit which bakes the wafer W at a low temperature, an aging unit which gelates the coating film such as a low-k film formed on the wafer W, and a heat treatment unit which performs the heat treatment of the present invention, for example, a hardening process, on the coating film formed on the wafer W, the units being vertically stacked. The heat treatment unit is configured to heat the wafer W having the coating film under a reducing organic compound atmosphere. The processing unit set 14 includes a high temperature hot plate unit which bakes the wafer W at a high temperature, a delivery unit for performing a delivery of the wafer W to/from the carrier station (CSB) 3, and a cooling plate unit for cooling the wafer W, the units being vertically stacked.

The transfer arm 15 can move up and down, rotate horizontally and move forward and backward so as to access the coating process units (SCT) 11 and 12 and the respective processing units of the processing unit sets 13 and 14.

The side cabinet 2 includes bubblers (Bub) 27 used in the processing unit sets 13 and 14 and the like, and a trap (TRAP) 28 for cleaning an exhaust gas discharged from each unit. Further, a power supply, a liquid chemical storage part for storing pure water or an organic compound such as formic acid (HCOOH), and a drain for discharging waste of a processing solution used in the SOD system 100 are disposed, for example, under the bubblers (Bub) 27 (all are not shown).

The carrier station (CSB) 3 includes a mounting table for mounting a cassette accommodating the wafer W, and a transfer mechanism for transferring the wafer W between the cassette mounted on the mounting table and the delivery unit disposed in the processing section 1 (both are not shown).

Each component, for example, each processing unit of the SOD system 100 is connected to and controlled by a system controller 90 having a microprocessor (computer). The system controller 90 is connected to a user interface 91 including a keyboard for inputting commands, a display for displaying an operation status of the SOD system 100 and the like such that an operator manages the SOD system 100. The system controller 90 is also connected to a storage unit 92 which stores a recipe including a control program for performing various processes under control of the system controller 90 in the SOD system 100 or a program for performing a process in each component of the SOD system 100 in accordance with process conditions. The recipe is stored in a storage medium of the storage unit 92. The storage medium may be a hard disk or a semiconductor memory, or a portable medium such as a CD-ROM and a flash memory or the like. Further, the recipe may be appropriately transmitted from another device through, for example, a dedicated line.

Further, if necessary, a certain recipe may be retrieved from the storage unit 92 in accordance with the commands inputted through the user interface 91 and executed in the system controller 90 such that a desired process is performed in the SOD system 100 under control of the system controller 90.

In the SOD system 100, when a coating film such as a low-k film is formed on the wafer W by employing a silk method and a speed film method, the wafer W is transferred from the carrier station (CSB) 3 in a sequence of the delivery unit→the cooling plate unit→the coating process unit (SCT) 12→the low temperature hot plate unit→the cooling plate unit→the coating process unit (SCT) 11→the low temperature hot plate unit→the high temperature hot plate unit→the heat treatment unit, and a specific process is performed on the wafer W in each unit. In this case, an adhesion promoter is coated in the coating process unit (SCT) 12, and a coating solution for a low-k film is coated in the coating process unit (SCT) 11. When a coating film such as a low-k film is formed by a fox method, the wafer W is transferred in a sequence of the delivery unit→the cooling plate unit→the coating process unit (SCT) 11→the low temperature hot plate unit→the high temperature hot plate unit→the heat treatment unit, and a specific process is performed on the wafer W in each unit. When a coating film such as a low-k film is formed by a sol-gel method, the wafer W is transferred in a sequence of the delivery unit→the cooling plate unit→the coating process unit (SCT) 11→the aging unit→the low temperature hot plate unit→the high temperature hot plate unit, and a specific process is performed on the wafer W in each unit.

When a silk method, a speed film method or a fox method is used, in a final process, a heat treatment, for example, a hardening process, is performed on a coating film such as a low-k film in the heat treatment unit.

As described above, conventionally, the heat treatment such as a hardening process of the coating film is performed by heating the wafer W under an atmosphere of a nitrogen gas, a hydrogen gas or an ammonia gas. However, it is difficult to sufficiently suppress degradation (oxidation) of the coating film due to impurities such as oxygen contained in the atmosphere in the conventional method. Accordingly, in the embodiment of the present invention, the heat treatment is performed on the coating film such as a low-k film by heating the wafer W under a reducing organic compound atmosphere from the fact that an organic compound easily dissociates compared to hydrogen, ammonia or the like. Thus, oxygen in the atmosphere can be efficiently removed by a reduction reaction of the organic compound, thereby surely preventing degradation of the coating film such as a low-k film.

The reducing organic compound includes alcohol having a hydroxyl group (—OH), aldehyde having an aldehyde group (—CHO), or carboxylic acid having a carboxyl group (—COOH). Further, two or more types of alcohol, aldehyde and carboxylic acid may be used as the reducing organic compound.

The alcohol includes first class alcohol, particularly, first class alcohol having the following formula (1)

$$R^1\text{—OH} \tag{1}$$

($R^1$ is a straight or branched $C_1$~$C_{20}$ alkyl or alkenyl group, preferably, methyl, ethyl, propyl, butyl, pentyl or hexyl), for example, methanol ($CH_3OH$), ethanol ($CH_3CH_2OH$), propanol ($CH_3CH_2CH_2OH$), butanol ($CH_3CH_2CH_2CH_2OH$), 2-methyl-propanol (($CH_3)_2CHCH_2OH$), and 2-methyl butanol ($CH_3CH_2CH(CH_3)\,CH_2OH$);

second class alcohol, particularly, second class alcohol having the following formula (2)

[Equation 1]

$$\underset{\underset{R^1\text{—CH—}R^1}{|}}{OH} \tag{2}$$

($R^1$ is a straight or branched $C_1$~$C_{20}$ alkyl or alkenyl group, preferably, methyl, ethyl, propyl, butyl, pentyl or hexyl), for example, 2-propanol (($CH_3)_2CHOH$), and 2-butanol ($CH_3CH(OH)CH_2CH_3$);

polyhydroxy alcohol such as diol or triol, for example, ethylene glycol ($HOC_2CH_2OH$), glycerol ($HOCH_2CH(OH)CH_2OH$);

cyclic alcohol having 1~10, typically, 5~6 carbon atoms in a portion of a ring;

benzyl alcohol ($C_6H_5CH_2OH$), aromatic alcohol of o-, p- or m-cresol, resorcinol, etc.;

halogenated alcohol, particularly, halogenated alcohol having the following formula (3)

$$CH_nX_{3-n}\text{—}R^2\text{—OH} \tag{3}$$

(X is F, Cl, Br or I, preferably, F or Cl, n is an integral number of 0~2, and $R^2$ is a straight or branched $C_1$~$C_{20}$ alkyl or alkenyl group, preferably, methylene, ethylene, trimethylene, tetramethylene, pentamethylene or hexamethylene), for example, 2,2,2-trifluoroethanol ($CF_3CH_2OH$);

other alcohol derivatives, for example, methylethanolamine ($CH_3NHCH_2CH_2OH$).

The aldehyde includes aldehyde having the following formula (4)

$$R^3\text{—CHO} \tag{4}$$

($R^3$ is hydrogen, or a straight or branched $C_1$~$C_{20}$ alkyl or alkenyl group, preferably, methyl, ethyl, propyl, butyl, pentyl or hexyl), for example, formaldehyde (HCHO), acetaldehyde ($CH_3CHO$) and butylaldehyde ($CH_3CH_2CH_2CHO$);

alkanediol compounds having the following formula (5)

$$OHC\text{—}R^4\text{—CHO} \tag{5}$$

($R^4$ is a straight or branched $C_1$~$C_{20}$ saturated or unsaturated hydrocarbon, but both aldehyde groups may be coupled to each other without $R^4$);

halogenated aldehyde;
other aldehyde derivatives and the like.

The carboxylic acid includes carboxylic acid having the following formula (6)

$$R^5\text{—COOH} \quad (6)$$

($R^5$ is a hydrogen, or straight or branched $C_1 \sim C_{20}$ alkyl or alkenyl group, preferably, methyl, ethyl, propyl, butyl, pentyl or hexyl), for example, the aforementioned formic acid, and acetic acid ($CH_3COOH$);
polycarboxylic acid;
carboxylic acid halide;
other carboxylic acid derivatives and the like.

Materials of the low-k film, to which the heat treatment method in accordance with the present invention is more effectively applied, may include siloxane-based hydrogen-silsesquioxane (HSQ) containing Si, 0 and H, methyl-silsesquioxane (MSQ) containing Si, C, O and H, FLARE (manufactured by Honeywell Inc.) made of organic polyallylene ether, SILK (manufactured by the Dow Chemical Company) made of polyallylene hydrocarbon, Parylene, BCB, PTFE, fluorinated polyimide, porous MSQ, porous SILK, porous silica and the like.

Further, materials of a hard mask film or an etching stopper film, to which the heat treatment method in accordance with the present invention is more effectively applied, may include polybenzoxazole.

Hereinafter, the heat treatment unit mounted on the SOD system 100 will be described in detail.

Figure 2:
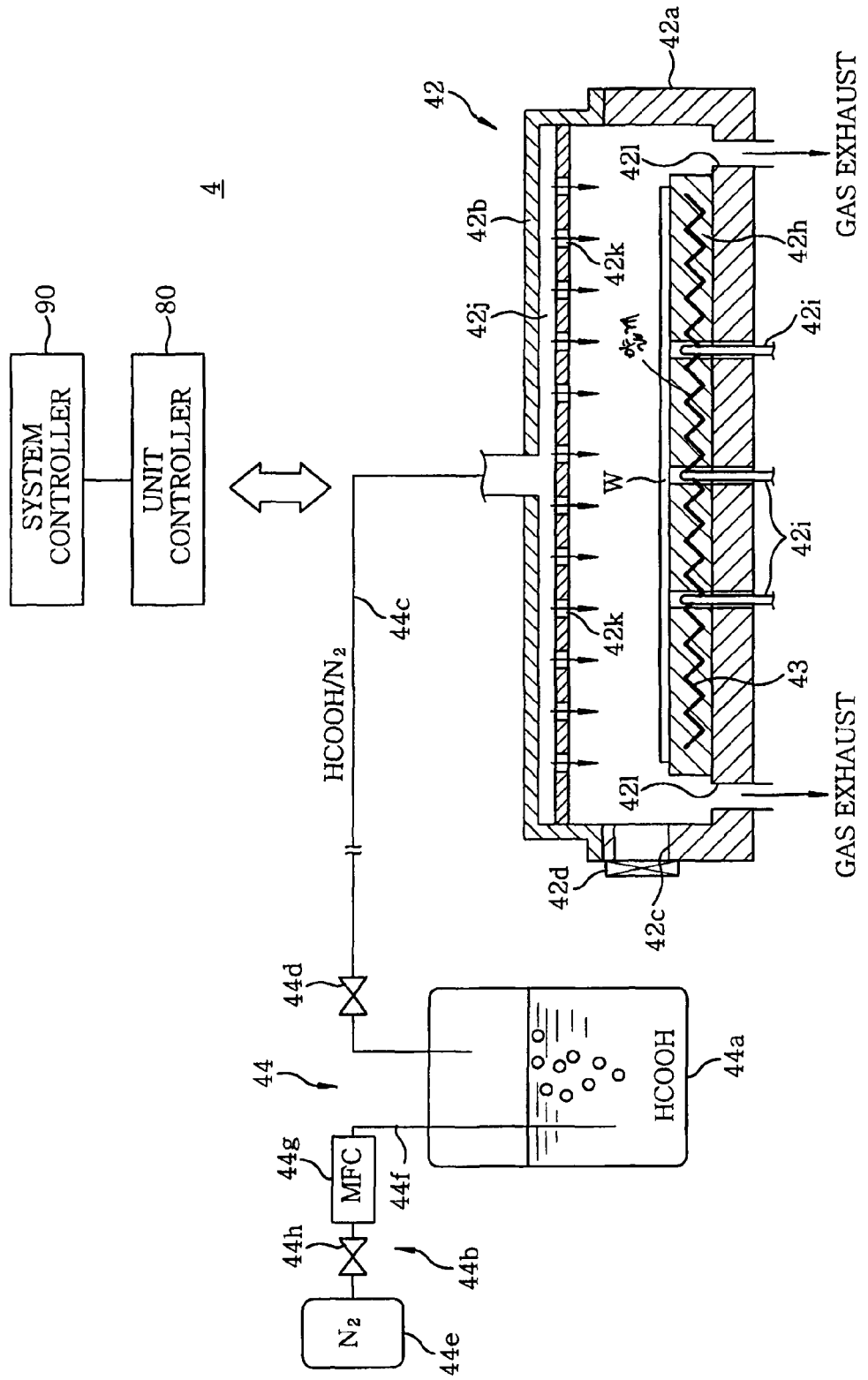
FIG. 2 schematically shows a cross sectional view of the heat treatment unit.

FIG. 2 schematically shows a cross sectional view of the heat treatment unit.

The heat treatment unit (heat treatment apparatus) 4 includes a chamber (processing chamber) 42 capable of accommodating the wafer W, a heater 43 for heating the wafer W in the chamber 42, and a formic acid supply device 44 serving as an organic compound supply device for supplying a reducing organic compound, for example, formic acid (HCOOH) into the chamber 42.

The chamber 42 includes an approximately cylindrical or box-shaped chamber main body 42*a* having an upper opening, and a lid 42*b* for closing the upper opening of the chamber main body 42*a*. A loading/unloading port 42*c* is formed at a sidewall of the chamber main body 42*a* to load/unload the wafer W to/from the chamber 42 by using the transfer arm 15 (see FIG. 1). Also, a shutter 42*d* for opening and closing the loading/unloading port 42*c* is formed at the sidewall of the chamber main body 42*a*.

A discharge port 42*l* is formed in the chamber main body 42*a*, for example, at its bottom portion, to discharge formic acid supplied by the formic acid supply device 44 out of the chamber 42. Further, a mounting table 42*h* is disposed in the chamber main body 42*a*, for example, at its bottom portion, to mount the wafer W thereon. The heater 43 is embedded in the mounting table 42*h* to heat the wafer W to a specific temperature, for example, 200~400° C. through the mounting table 42*h*. Supporting pins 42*i* are provided in the mounting table 42*h* to be moved up and down such that the supporting pins 42*i* can be protruded from an upper surface of the mounting table 42*h* when moved up and retracted into the mounting table 42*h* when moved down. When the supporting pins 42*i* are protruded, the wafer W is delivered to/from the transfer arm 15. When the supporting pins 42*i* are retracted, the wafer W is mounted on the mounting table 42*h*.

The lid 42*b* is formed in an approximately cylindrical or box shape having a flat diffusion space 42*j* therein. Further, the lid 42*b* has a number of discharge holes 42*k* on its bottom surface to discharge formic acid supplied from the formic acid supply device 44. The formic acid is supplied through the upper surface of the lid 42*b* into the diffusion space 42*j* from the formic acid supply device 44. The formic acid diffused in the diffusion space 42*j* is supplied through the discharge holes 42*k* into the chamber 42 or the chamber main body 42*a*.

The formic acid supply device 44 includes a formic acid storage part 44*a* for storing, for example, liquid formic acid, a bubbler 44*b* for bubbling the formic acid in the formic acid storage part 44*a* by supplying a nonreactive gas, for example, nitrogen ($N_2$) gas into the formic acid storage part 44*a*, a supply line 44*c* for supplying formic acid and nitrogen gas bubbled by the bubbler 44*b* into the diffusion space 42*j* of the lid 42*b*, and a valve 44*d* for opening and closing the supply line 44*c*. The bubbler 44*b* includes a nonreactive gas storage part 44*e* for storing a nitrogen gas, a supply line 44*f* for supplying the nitrogen gas in the nonreactive gas storage part 44*e* to the formic acid storage part 44*a*, and a mass flow controller 44*g* and a valve 44*h* for controlling a flow rate of the nitrogen gas flowing in the supply line 44*f*.

The heat treatment unit 4 is controlled by the unit controller 80 connected to the system controller 90. Further, if necessary, the system controller 90 retrieves a specific recipe from the storage unit 92 in accordance with the commands inputted through the user interface 91 to control the unit controller 80.

Next, a process performed in the heat treatment unit 4 will be described in detail.

In the heat treatment unit 4, first, when the wafer W is transferred into the chamber 42 through the loading/unloading port 42*c* by the transfer arm 15 (see FIG. 1), the supporting pins 42*i* are moved up to be protruded from the upper surface of the mounting table 42*h*, and receive the wafer W from the transfer arm 15. Then, the supporting pins 42*i* are moved down to be immersed inside the mounting table 42*h* such that the wafer W is mounted on the mounting table 42*h*. Further, in this case, the transfer arm 15 is retracted through the loading/unloading port 42*c* to the outside of the chamber 42, and the loading/unloading port 42*c* is closed by a shutter 42*d*.

When the wafer W is mounted on the mounting table 42*h* and the loading/unloading port 42*c* is closed, gaseous formic acid formed by bubbling and nitrogen gas are supplied into the chamber 42 by the formic acid supply device 44. The inside of the chamber 42 is maintained under an atmosphere of formic acid and nitrogen gas having a low oxygen density (for example, 50 ppm or less). By bubbling the liquid formic acid at a normal temperature and pressure to supply the formic acid into the chamber 42, the formic acid can be diffused in the chamber 42 without reducing the inner pressure of the chamber 42 to a specific pressure. Oxygen can be efficiently removed from the chamber 42 by a reduction reaction of the formic acid. Further, in this case, since the formic acid is supplied into the chamber 42 through the supply line 44*c* in a diluted state with nitrogen gas, it is possible to prevent the supply line 44*c* and the chamber 42 from being corroded by the formic acid. Further, the formic acid and nitrogen gas filled in the chamber 42 are discharged through the discharge port 42*l*.

When the inside of the chamber 42 is maintained under an atmosphere of formic acid and nitrogen gas having a low oxygen density, the wafer W is heated to a specific temperature of, for example, 200~400° C. by the heater 43. Accordingly, since the coating film such as a low-k film formed on the wafer W is hardened in an atmosphere almost free of oxygen, degradation is prevented. Further, products, for example, moisture and carbon dioxide, produced in a reduction reaction of formic acid serving as an organic compound, are discharged through the discharge port 42*l*.

Once the wafer W is completely heated by the heater 43, the supply of the formic acid and nitrogen gas from the formic acid supply device 44 is stopped. Further, while the supporting pins 42i are moved up to lift the wafer W from the mounting table 42h, the loading/unloading port 42c is opened by the shutter 42d and the transfer arm 15 receives the wafer W from the supporting pins 42i to transfer the wafer W to the outside of the chamber 42 through the loading/unloading port 42c.

Further, it is preferable to quickly cool the coating film such as a low-k film and the wafer W after the heat treatment using the heat treatment unit 4. Accordingly, a cooling unit for cooling the wafer W is disposed adjacent to the heat treatment unit 4. After the heat treatment using the heat treatment unit 4, the wafer W may be transferred to the cooling unit to cool the wafer W.

Next, application of the heat treatment using the heat treatment unit 4 to a damascene process will be described.

Figure 3:
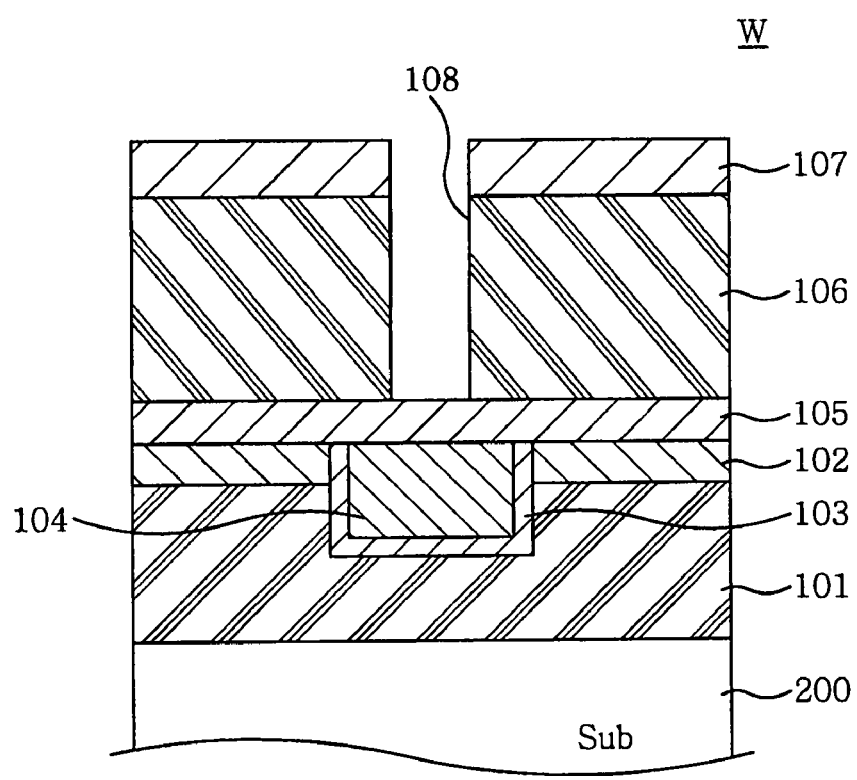
FIG. 3 illustrates a cross sectional view of a wafer W in a damascene process.

FIG. 3 illustrates a cross sectional view of the wafer W in a damascene process.

In the damascene process, for example, first, a first low-k film 101 is formed on a Si substrate (Sub) 200. The first low-k film 101 is formed through the process of the SOD system 100. In a final process using a silk method, speed film method or fox method, a heat treatment, for example, a hardening process is performed in the heat treatment unit 4. Then, a hard mask film 102 is formed on the first low-k film 101. The hard mask film 102 is also formed through the same process as the first low-k film 101.

After the first low-k film 101 and the hard mask film 102 are formed, the hard mask film 102 is etched while a resist film (not shown) patterned by a photolithography is used as a mask. Further, a groove is formed in the first low-k film 101 by etching while the resist film and the etched hard mask film 102 are used as a mask. Further, a barrier metal film 103 and a wiring layer 104 made of copper (Cu) are formed in the groove formed in the first low-k film 101. An etching stopper film 105, a second low-k film 106 and a hard mask film 107 are sequentially formed on the barrier metal film 103, the wiring layer 104 and the hard mask film 102. The etching stopper film 105, the second low-k film 106 and the hard mask film 107 are formed through the same process as the first low-k film 101.

After the hard mask film 107 is formed, the hard mask film 107 is etched while a resist film (not shown) patterned by a photolithography is used as a mask, and a hole 108 is formed in the second low-k film 106 by etching while the resist film and the etched hard mask film 107 are used as a mask as shown in FIG. 3.

Then, the etching stopper film 105 is etched while the hard mask film 107 is used as a mask to expose the wiring layer 104, thereby forming a via hole. A via contact formed of barrier metal and Cu is filled in the via hole. Further, the surface of Cu is polished by using a CMP method to form a wiring portion of a damascene structure.

In this case, the heat treatments are sequentially and individually performed on the first low-k film 101, the hard mask film 102, the etching stopper film 105, the second low-k film 106 and the hard mask film 107 by the heat treatment unit 4 before etching, but the present invention is not limited thereto. A plurality of heat treatments may be performed on the first low-k film 101, the second low-k film 106, the hard mask films 102 and 107 and the etching stopper film 105 at the same time or after etching or polishing.

Next, a heat treatment apparatus of another embodiment capable of performing the heat treatment method in accordance with the present invention will be described.

Figure 4:
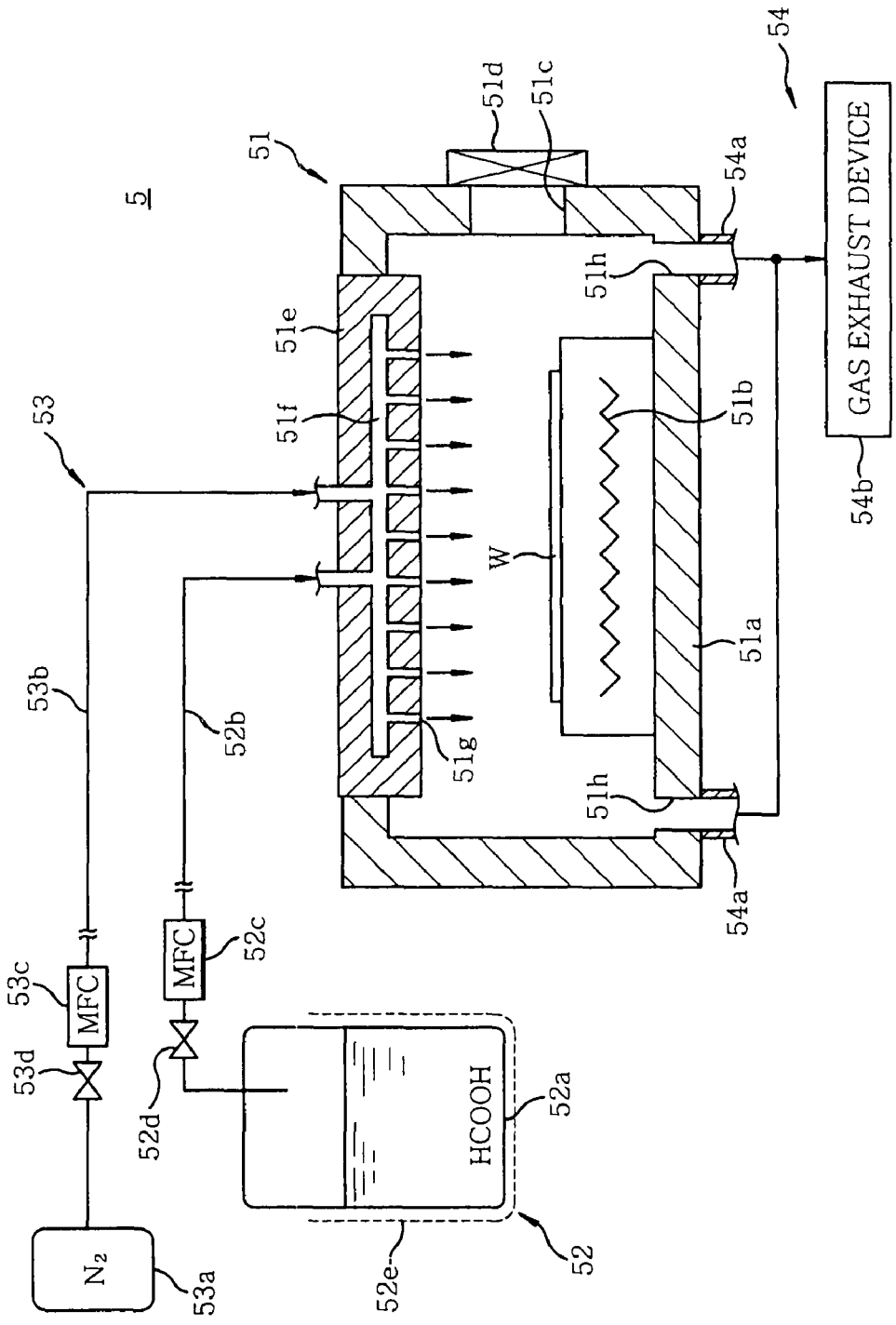
FIG. 4 schematically shows a cross sectional view of a heat treatment apparatus of another embodiment capable of performing the heat treatment method in accordance with the present invention.

FIG. 4 schematically shows a cross sectional view of a heat treatment apparatus of another embodiment capable of performing the heat treatment method in accordance with the present invention.

In this embodiment of the present invention, a heat treatment apparatus 5, which performs a heat treatment on the wafer W under a specific depressurized atmosphere, for example, a vacuum atmosphere, is explained. The heat treatment apparatus 5 is used when a low-k film, a hard mask film or the like is formed in a depressurized or vacuum process by employing, for example, a CVD method. The heat treatment apparatus 5 includes a chamber 51 capable of accommodating the wafer W, a formic acid supply device 52 for supplying formic acid into the chamber 51, a nitrogen gas supply device 53 for supplying a nitrogen gas, serving as a diluent gas for diluting the formic acid or a nonreactive gas, into the chamber 51, and a depressurizing device 54 capable of reducing the inner pressure of the chamber 51 to a predetermined pressure, for example, a vacuum pressure. Further, the heat treatment apparatus 5 is controlled in the same way as the heat treatment unit 4.

The chamber 51 is formed in an approximately cylindrical or box shape having an upper opening. A susceptor 51a for mounting the wafer W is disposed at a bottom portion of the chamber 51. A heater 51b is embedded into the susceptor 51a to heat the wafer W. A loading/unloading port 51c for loading/unloading the wafer W to/from the chamber 51 and a gate valve 51d for opening and closing the loading/unloading port 51c is formed at the sidewall of the chamber 51.

A shower head 51e is disposed at an upper portion of the chamber 51 to close the opening and face the susceptor 51a. The shower head 51e includes a diffusion space 5 1f for diffusing the formic acid supplied from the formic acid supply device 52 and the nitrogen gas supplied from the nitrogen gas supply device 53. Further, the shower head 51e includes a plurality of discharge holes 51g formed on its surface facing the susceptor 51a to discharge the formic acid supplied from the formic acid supply device 52 and the nitrogen gas supplied from the nitrogen gas supply device 53 into the chamber 51.

A gas exhaust port 51h is formed in a lower wall of the chamber 51. A depressurizing device 54 includes a gas exhaust pipe 54a connected to the gas exhaust port 51h and a gas exhaust device 54b for compulsorily discharging gas out of the chamber 51 through the gas exhaust pipe 54a.

The formic acid supply device 52 includes a formic acid storage part 52a for storing formic acid, a supply line 52b for supplying formic acid in the formic acid storage part 52a into the diffusion space 51f of the shower head 51e, and a mass flow controller 52c and a valve 52d serving as a flow rate controller for controlling a flow rate of the formic acid flowing in the supply line 52b. A heater 52e is disposed at the formic acid storage part 52a to heat the formic acid to a specific temperature.

The nitrogen gas supply device 53 includes a nitrogen gas supply source 53a, a supply line 53b for supplying a nitrogen gas in the nitrogen gas supply source 53a into the diffusion space 51f of the shower head 51e, and a mass flow controller 53c and a valve 53d serving as a flow rate controller for controlling a flow rate of the nitrogen gas flowing in the supply line 52b.

In the heat treatment unit 5, first, the wafer W is transferred into the chamber 51 through the loading/unloading port 51c and mounted on the susceptor 51a. The loading/unloading port 51c is closed with the gate valve 51d to seal the inside of the chamber 51. Then, the inner pressure of the chamber 51 is reduced to a predetermined pressure, for example, a vacuum pressure, by the depressurizing device 54. Further, a nitrogen gas is supplied into the chamber 51 from the nitrogen gas supply device 53 and formic acid is supplied into the chamber 51 from the formic acid supply device 52. Accordingly, the inside of the chamber 51 is maintained under an atmosphere of formic acid and nitrogen gas having a low oxygen density (for example, 50 ppm or less). In this case, since the inside of the chamber 51 is maintained at a predetermined pressure, for example, a vacuum pressure by the depressurizing device 54, it is possible to diffuse the formic acid in the chamber 51. Further, since the formic acid is diluted with the nitrogen gas, it is possible to prevent corrosion of the chamber 51. Further, the depressurization, the supply of the nitrogen gas, and the supply of the formic acid may be performed at the same time or alternately at predetermined intervals by the depressurizing device 54, the nitrogen gas supply device 53 and the formic acid supply device 52, respectively. After the inside of the chamber 51 is maintained under an atmosphere of formic acid and nitrogen gas having a low oxygen density, the wafer W is heated to a temperature of 200~400° C. by the heater 51b. In this way, the low-k film, hard mask film or the like formed on the wafer W is hardened. Once the wafer W is completely heated by the heater 51b, the depressurization using the depressurizing device 54, the supply of the nitrogen gas using the nitrogen gas supply device 53, and the supply of the formic acid using the formic acid supply device 52 are stopped. The loading/unloading port 51c is opened by the gate valve 51d, and the wafer W is unloaded from the chamber 51 through the loading/unloading port 51c.

In this embodiment, since the wafer W is heated under an atmosphere of formic acid without being exposed to air, it is possible to surely prevent degradation of the low-k film, hard mask film or the like formed on the wafer W.

Materials of the low-k film, to which the heat treatment method in accordance with the present invention is more effectively applied, may include SiOC-based materials (a methyl group (—$CH_3$) is introduced into a Si—O bond of $SiO_2$ and mixed with Si—$CH_3$) such as Black Diamond (manufactured by Applied Materials Inc.), Coral (manufactured by Novellus Inc.) and Aurora (manufactured by ASM Inc.), SiOF-based materials (fluorine (F) is introduced into $SiO_2$), CF-based materials using fluorocarbon gas and the like.

Further, materials of a hard mask film or an etching stopper film in addition to the low-k film formed by a CVD method, to which the heat treatment method in accordance with the present invention is applicable, may include the same materials as the above-mentioned materials of the low-k film (having a higher dielectric constant than the low-k film), silicon carbide (SiC), silicon carbonitride (SiCN) and the like.

Next, a heat treatment apparatus of still another embodiment capable of performing the heat treatment method in accordance with the present invention will be described.

Figure 5:
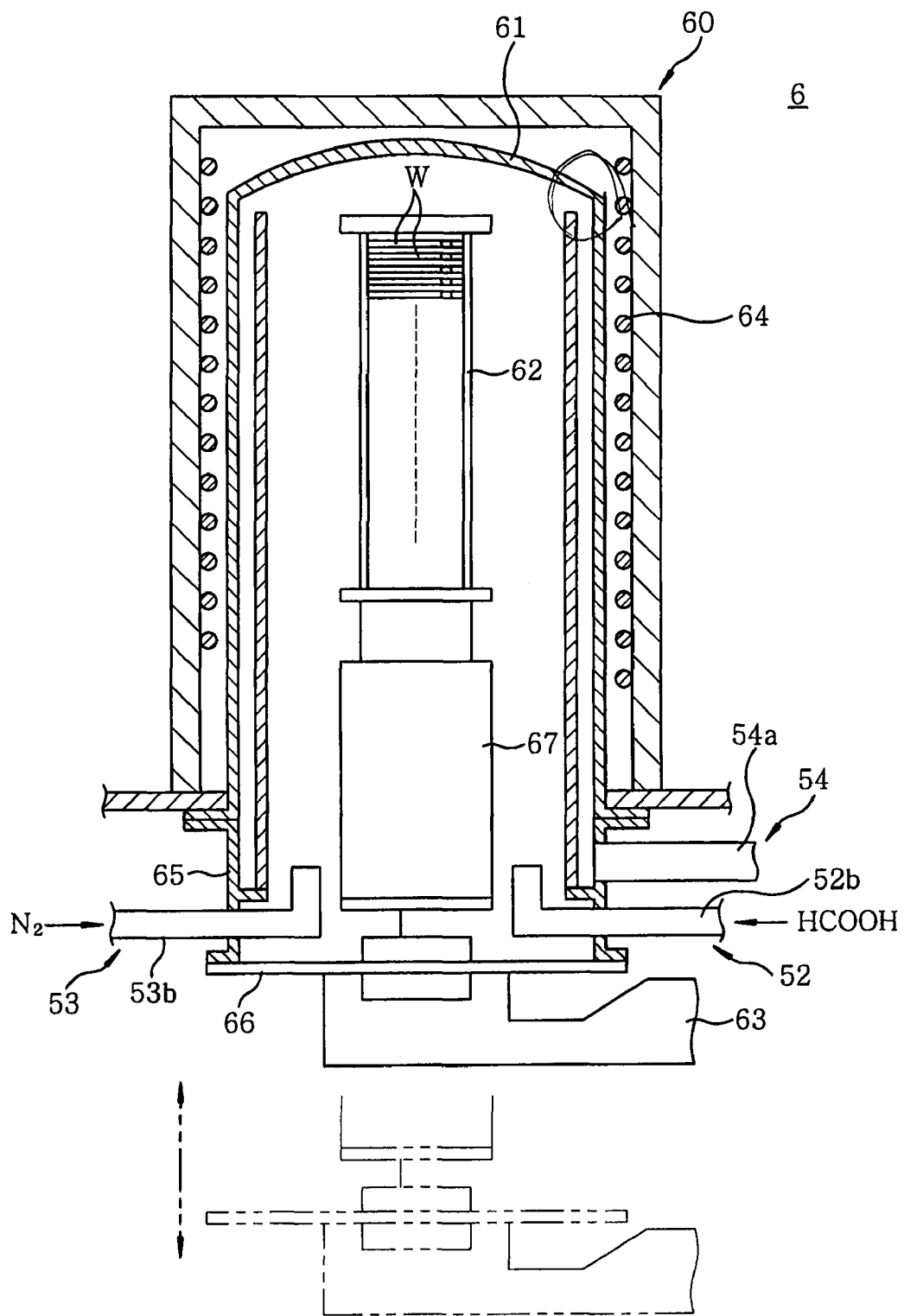
FIG. 5 schematically shows a cross sectional view of a heat treatment apparatus of still another embodiment capable of performing the heat treatment method in accordance with the present invention.

FIG. 5 schematically shows a cross sectional view of a heat treatment apparatus of still another embodiment capable of performing the heat treatment method in accordance with the present invention.

Although a single-wafer heat treatment apparatus, which heats the wafer W one by one in a vacuum atmosphere, is explained in the above embodiments, a batch type heat treatment apparatus 6, which heats a plurality of wafers W at the same time in a vacuum atmosphere, is explained in this embodiment. In the heat treatment apparatus 6, the same parts as those of the heat treatment apparatus 5 shown in FIG. 4 are designated by the same reference numerals and a description thereof is omitted.

In the same way as the heat treatment apparatus 5, the heat treatment apparatus 6 is used when a low-k film, a hard mask film or the like is formed by a CVD method in a depressurized or vacuum process. The heat treatment apparatus 6 includes an approximately cylindrical heat treatment furnace (processing chamber) 60 which has a lower opening and accommodates and heats a plurality of wafers W, a wafer boat 62 which supports the wafers W in the heat treatment furnace 60, a boat elevator 63 which elevates the wafer boat 62 such that the wafer boat 62 moves into or out of the heat treatment furnace 60, the formic acid supply device 52 which supplies formic acid into the heat treatment furnace 60, the nitrogen gas supply device 53 which supplies a nitrogen gas, serving as a diluent gas for diluting the formic acid or a nonreactive gas, into the heat treatment furnace 60, and the depressurizing device 54 capable of reducing the inner pressure of the heat treatment furnace 60 to a predetermined pressure, for example, a vacuum pressure. Further, the heat treatment apparatus 6 is controlled in the same way as the heat treatment unit 4 and the heat treatment apparatus 5.

A process tube 61 made of quartz is formed in the heat treatment furnace 60 in a shape corresponding to the shape of the heat treatment furnace 60. A heater 64 for heating the wafers W is provided at an outer periphery of the process tube 61 to surround the process tube 61. An annular or cylindrical manifold 65 is provided at a lower end of the process tube 61. The manifold 65 is connected to the supply line 52b of the formic acid supply device 52, the supply line 53b of the nitrogen gas supply device 53, and the gas exhaust pipe 54a of the depressurizing device 54 (other components of the formic acid supply device 52, the nitrogen gas supply device 53 and the depressurizing device 54 are not shown).

A cover part 66 is provided at the boat elevator 63. The cover part 66 is in contact with the manifold 65 to maintain the inside of the process tube 61 in a sealed state. A thermal insulation container 67 is mounted on the cover part 66.

In the heat treatment apparatus 6, first, in a state where the wafer boat 62 is moved down by the boat elevator 63, a plurality of wafers W are loaded into the wafer boat 62. Then, the wafer boat 62 is moved up by the boat elevator 63 to be received in the heat treatment furnace 60. Then, the inner pressure of the heat treatment furnace 60 is reduced to a predetermined pressure, for example, a vacuum pressure, by the depressurizing device 54. Further, a nitrogen gas is supplied into the heat treatment furnace 60 from the nitrogen gas supply device 53 and formic acid is supplied into the heat treatment furnace 60 from the formic acid supply device 52. Accordingly, the inside of the heat treatment furnace 60 is maintained under an atmosphere of formic acid and nitrogen gas having a low oxygen density (for example, 50 ppm or less). After the inside of the heat treatment furnace 60 is maintained under an atmosphere of formic acid and nitrogen gas having a low oxygen density, each wafer W is heated to a specific temperature of, for example, 200~400° C. by the heater 64. Accordingly, the low-k film, hard mask film or the like formed on each wafer W is hardened. When the wafers W are completely heated by the heater 64, the depressurization using the depressurizing device 54, the supply of the formic acid using the formic acid supply device 52 and the supply of the nitrogen gas using the nitrogen gas supply device 53 are stopped. Then, the wafer boat 62 is moved down by the boat elevator 63 and the wafers W are unloaded from the heat treatment furnace 60.

In this embodiment, since the wafers W are heated under an atmosphere of formic acid without being exposed to air, it is possible to more surely prevent oxidation of the films formed on the wafers W. Also, since the wafers W can be heated at the same time, it is possible to improve a production yield.

Materials of the low-k film and other films such as a hard mask film or an etching stopper film, to which the heat treatment method in accordance with the present invention is more effectively applied, may include the materials described in the above embodiment of the heat treatment apparatus 5.

Further, the present invention is not limited to the above embodiments, and the embodiments can be modified within the scope of the invention. For example, although the single-wafer heat treatment apparatus for heating the wafer at a normal pressure, the single-wafer heat treatment apparatus for heating the wafer at a reduced pressure and the batch type heat treatment apparatus for heating the wafers at a reduced pressure are described in the above embodiments, the present invention may be applied to a batch type heat treatment apparatus for heating wafers at a normal pressure. Further, various materials in addition to the above-mentioned materials may be used as a reducing organic compound. When those materials are solid or liquid at a normal temperature and pressure, they may be supplied in a gas phase into the processing chamber by a bubbling or thermal vaporization method in the same way as the formic acid.

INDUSTRIAL APPLICABILITY

The present invention may be applied to a baking process performed at a high temperature or low temperature before a hardening process, an aging process using a sol-gel method or the like by appropriately setting a heating temperature without being limited to a hardening process performed on a low-k film, a hard mask film or an etching stopper film formed on a substrate.

What is claimed is:

1. A heat treatment method comprising:
preparing a substrate having a coating film, the coating film being an insulating film formed by supplying a coating solution to the substrate; and
hardening the coating film by heating the substrate under an atmosphere of a reducing organic compound,
wherein the organic compound includes at least one of alcohol, aldehyde and carboxylic acid.

2. A heat treatment method comprising:
loading a substrate having a coating film into a processing chamber, the coating film being an insulating film formed by supplying a coating solution to the substrate;
supplying a gaseous reducing organic compound into the processing chamber; and
hardening the coating film by heating the substrate in the processing chamber supplied with the gaseous reducing organic compound,
wherein the gaseous reducing organic compound includes at least one of alcohol, aldehyde and carboxylic acid.

3. The heat treatment method of claim 2, wherein the gaseous reducing organic compound is produced by bubbling a liquid or solid organic compound by a nonreactive gas.

4. The heat treatment method of claim 3, wherein a diluent gas for diluting the gaseous reducing organic compound is supplied into the processing chamber when the gaseous reducing organic compound is supplied.

5. The heat treatment method of claim 2, wherein the substrate is heated in the processing chamber while an inner pressure of the processing chamber is reduced to a predetermined pressure.

6. A heat treatment apparatus comprising:
a processing chamber for accommodating a substrate having a coating film, the coating film being an insulating film formed by supplying a coating solution to the substrate;
an organic compound supply device for supplying a gaseous reducing organic compound into the processing chamber; and
a heater for hardening the coating film by heating the substrate in the processing chamber supplied with the gaseous reducing organic compound,
wherein the organic compound supply device supplies the gaseous reducing organic compound including at least one of alcohol, aldehyde and carboxylic acid.

7. The heat treatment apparatus of claim 6, wherein the organic compound supply device produces the gaseous reducing organic compound by bubbling a liquid or solid organic compound by a nonreactive gas and supplies the gaseous reducing organic compound into the processing chamber.

8. The heat treatment apparatus of claim 6, further comprising a diluent gas supply device which supplies a diluent gas for diluting the gaseous reducing organic compound into the processing chamber.

9. The heat treatment apparatus of claim 6, further comprising a depressurizing device for reducing an inner pressure of the processing chamber to a predetermined pressure at least when the substrate is heated by the heater.

10. A substrate processing apparatus comprising:
a coating process unit for forming a coating film on a substrate, the coating film being an insulating film formed by supplying a coating solution to the substrate; and
a heat treatment unit for performing a heat treatment on the substrate,
wherein the heat treatment unit includes:
a processing chamber for accommodating the substrate;
an organic compound supply device for supplying a gaseous reducing organic compound into the processing chamber; and
a heater for hardening the coating film by heating the substrate in the processing chamber supplied with the gaseous reducing organic compound,
wherein the organic compound supply device supplies the gaseous reducing organic compound including at least one of alcohol, aldehyde and carboxylic acid.

11. A computer-readable storage medium which is operated on a computer and stores a program for controlling a heat treatment apparatus, wherein the program controls the heat treatment apparatus to perform a heat treatment method including:
loading a substrate having a coating film into a processing chamber, the coating film being an insulating film formed by supplying a coating solution to the substrate;
supplying a gaseous reducing organic compound into the processing chamber; and
hardening the coating film by heating the substrate in the processing chamber supplied with the gaseous reducing organic compound,
wherein the gaseous reducing organic compound includes at least one of alcohol, aldehyde and carboxylic acid.

* * * * *